United States Patent [19]

McKee et al.

[11] 4,413,020
[45] Nov. 1, 1983

[54] DEVICE FABRICATION INCORPORATING LIQUID ASSISTED LASER PATTERNING OF METALLIZATION

[75] Inventors: William R. McKee, Plano; Russell H. Murdock; Eric F. Schulte, both of Richardson, all of Tex.

[73] Assignee: Texas Instruments Incorporated, Dallas, Tex.

[21] Appl. No.: 344,446

[22] Filed: Feb. 1, 1982

[51] Int. Cl.³ .................. B05D 3/06; B05D 5/12; B23K 9/00
[52] U.S. Cl. ............. 427/53.1; 219/121 LF; 219/121 LM; 427/99; 427/345
[58] Field of Search ...... 219/121 L, 121 LE, 121 LF, 219/121 LM; 427/53.1, 99, 345

[56] References Cited

U.S. PATENT DOCUMENTS

| | | | |
|---|---|---|---|
| 4,202,003 | 5/1980 | Darley et al. | 357/22 X |
| 4,272,775 | 6/1981 | Compton et al. | 219/121 L X |
| 4,289,381 | 9/1981 | Garvin et al. | 219/121 LJ X |

*Primary Examiner*—Michael R. Lusignan
*Attorney, Agent, or Firm*—Melvin Sharp; James T. Comfort; Robert Groover, III

[57] ABSTRACT

Laser patterning of metallization is done by transmitting laser energy through a liquid film directly in contact with the metallization to be patterned. When the metal is evaporated by the laser energy, the vapor is condensed immediately by the liquid film. This prevents redeposition of metal on the patterned surface and suspends the removed metal in the liquid so that it may be reclaimed by filtration.

7 Claims, 4 Drawing Figures

DEVICE FABRICATION INCORPORATING LIQUID ASSISTED LASER PATTERNING OF METALLIZATION

BACKGROUND OF THE INVENTION

This invention relates to integrated circuit metallization patterning in general, and in particular to laser patterning of integrated circuit metallization.

The use of thin film metallization in the fabrication of integrated circuits is well known. The patterning of the metallization is also well known, and both are typical integrated circuit fabrication processes. An example of this use is disclosed by Darley et al in U.S. Pat. No. 4,202,003, which is hereby incorporated by reference.

The use of lasers in patterning of metallization is a relatively recent development. Schulte et al, in U.S. patent application Ser. No. 189,495 discloses the use of laser to sublimate metal from areas where the material underneath the metal had very low heat transfer capability. After sublimation, metal vapor is moved away by convection.

The removal of the metal vapor by convection has some problems. For one, some of the metal is redeposited back on the surface. Also, in cases where recovery of the removed metal is desirable, that task is difficult. Another consideration is that unconfined vaporized metal tends to condense on the final laser optics, resulting in damage to them.

Other vapor collection schemes have been considered, such as gas jets, vacuum collectors, and electrostatic collectors, but were found to be unsuccessful, inefficient, impractical, or expensive and difficult to implement.

It is therefore an object of this invention to provide a method for confining vaporized metal after sublimation of the metal by laser energy. It is a further object of this invention to provide a means for a simple reclamation process allowing almost 100% recovery of removed metal.

SUMMARY OF THE INVENTITON

In one aspect of the present invention, there is provided a method for preventing the redeposition of material removed by laser energy. As taught by Schulte et al, metal is sublimated to a vapor state by laser energy. In the present invention, the vapor is controlled by being immediately condensed in a thin film of liquid directly in contact with the surface to be patterned. The metal is suspended in the liquid, avoiding redeposition on any surface.

In another aspect of the invention, the condensation of metal vapor in the liquid and subsequent suspension therein facilitates the recovery of the removed metal. This allows almost 100% recovery of the metal removed, and could be quite significant, depending on the value of the metal used.

In one embodiment of the present invention, a substrate with metallization thereon is placed on a mylar sheet, the metallization facing up. A small amount of liquid is placed on the substrate face, and a second sheet of mylar placed on top. A thin film of liquid is trapped on the structure's surface, and the package is ready for laser processing. After processing, the mylar sheets are separated, and the sheets and structure rinsed to remove metal residue for subsequent collection.

In a second embodiment, a metallized substrate is placed in a glass-covered cavity. The cavity is filled with a liquid and sealed. The package is then ready for laser processing. Post-process rinse is similar to that of the embodiment previously described. In an alternative to this embodiment, the liquid in the cavity is circulated through the cavity during processing. The flow is stopped to change structures.

In a third embodiment, there is provided a glass-covered cavity through which structures and liquid are continuously moved. As the structure being patterned moves beneath the glass, liquid is continuously moving between the structure and the glass cover, and the laser beam is optically scanned across the surface of the structure in a motion perpendicular to the direction of travel of the structure. The liquid is directed through a metal recovery filter, and is returned to the cavity.

DETAILED DESCRIPTION OF THE INVENTION

Figure 1:
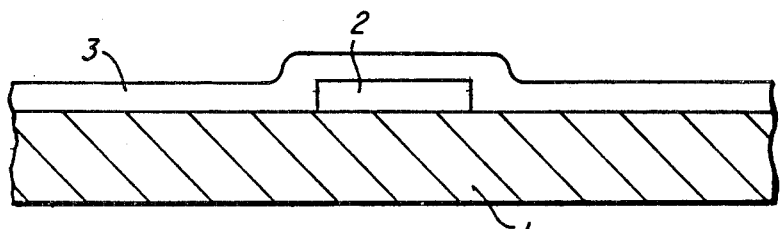
FIG. 1 shows a cross section of a structure of the type capable of being patterned by a laser process.

Referring now to the drawings, there is shown in FIG. 1, a silicon substrate 1 such as an integrated circuit substrate, having an area of insulator 2 with a low thermal conductivity characteristic, for example, silicon oxide. Deposited over the substrate 1 and oxide 2 is a layer of metal 3. This is a preferred structure for laser patterning as taught by Schulte et al. The higher thermal conductivity silicon underneath the metal helps to slow down the heat buildup in the metal from the laser beam, resulting in the metal over the silicon not being evaporated. The metal over the oxide has much less of the heat build-up in it drawn off by the silicon oxide, and rapidly reaches the temperature at which it evaporates.

Figure 2:
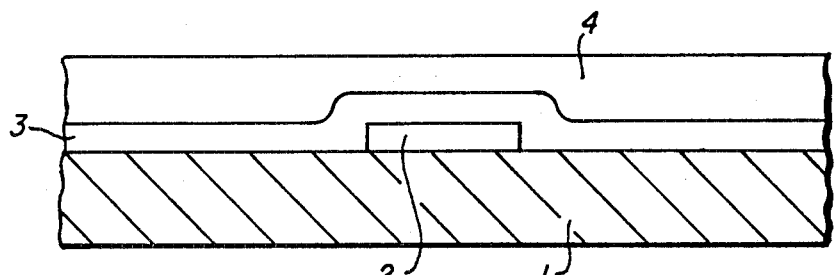
FIG. 2 shows a cross section of a package ready for laser processing.

FIG. 2 shows the substrate and insulator 2 with the metal layer 3 deposited thereon, and a thin film of liquid 4. The liquid chosen should be one that has minimum absorption of incident laser energy to prevent vaporization during the process. Water would be a good liquid to use; however, any clear liquid that has minimum energy absorbency and is optically transparent to the laser being used would be acceptable. Water is suitable for certain low power operations and certain metals not affected by water. In other applications where higher powers necessitate better quenching of vapor, or where corrodable metals are present, other liquids may be used. The thickness of the liquid film is not critical except that in the case where the film might be so thin as to not be able to condense all the metal vapor before it has a chance to deposit back on the original surface or on the back side of the cover. Typical thicknesses of the film would be from 0.005" to 1.0", varying with type of metallization, laser wavelength, type of liquid, and scanning methods.

Figure 3:
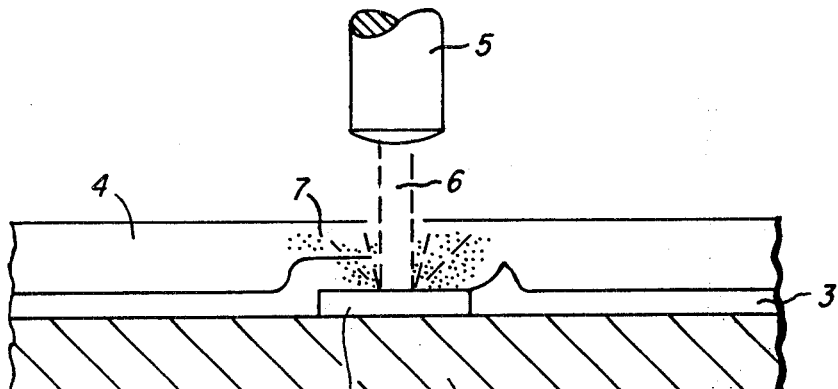
FIG. 3 shows a cross section of a package with the laser removing the material over the low conductivity material, the evaporated material being condensed immediately, and suspended in the liquid.
Figure 4:
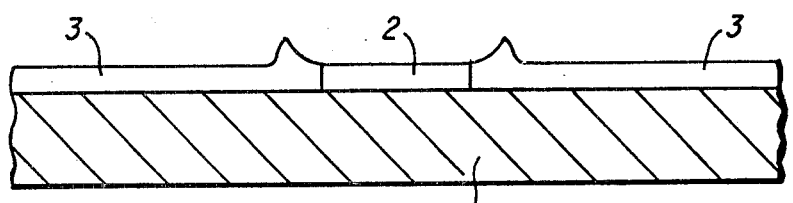
FIG. 4 shows the resultant structure after laser processing.

FIG. 3 is a cross section of the structure during the laser process. The metal 3 is vaporized by a laser beam 6 from the laser source 5. As the metal 3 vaporizes, the vapor 7 is condensed immediately by the liquid 4 to avoid redeposition and facilitate reclamation of the removed metal. FIG. 4 shows a processed structure after rinsing to remove any metal residue and prepare for the next step.

The present invention provides a needed process for solution of problems that might hinder a very promosing industrial tool. The process will allow a clean, precise metallization pattern to be produced, and allow for reclamation of precious metals with an ease not previously possible.

This invention is not only applicable to laser patterning where difference in thermal conductivity leads to patterning (i.e., silicon/oxide pattern); but also applies where metal is laser stripped from an insulating substrate (i.e., glass plate) and patterning is accomplished by controlling the position and intensity of the laser beam. This would be applicable to mask and reticle generation and repair using a laser.

In the claims:

1. A method for patterning a layer of material on a substrate comprising the following steps:
    (a) selecting a substrate having a high thermal conductivity;
    (b) forming a layer of insulating material over those areas of the substrate not requiring contact with a succeeding layer of the structure;
    (c) depositing on said insulating layer and on said substrate where exposed by said insulating layer, a thin layer of a material capable of absorbing radiated energy easily;
    (d) maintaining a thin film of liquid in direct contact with material to be patterned for confinement and collection of removed material;
    (e) subjecting said thin layer of material and overlying liquid film to radiant energy sufficient to cause sublimation of areas of said thin layer of material that are over said insulating material.

2. A method as in claim 1, wherein said sublimated material is condensed in said thin film of liquid, and said liquid is filtered after removal for recovery of said condensed material.

3. A method for patterning metal in an integrated circuit, comprising the steps of:
    providing a substrate having a layer of metal to be patterned on a surface thereof;
    maintaining a thin film of liquid in direct contact with said layer of metal to be patterned, for confinement and collection of removed metal; and
    subjecting said metal and overlying liquid film to a laser process for removing areas of metal not wanted.

4. The method of claim 3, further comprising the subsequent step of:
    filtering said liquid after completion of laser process, for recovery of said metal removed from the composite substrate.

5. The method of claim 1, wherein said liquid comprises water.

6. The method of claim 3, wherein said liquid comprises water.

7. The method of claim 6, wherein said liquid consists of water.

* * * * *